United States Patent
Lee et al.

(10) Patent No.: US 10,878,903 B2
(45) Date of Patent: Dec. 29, 2020

(54) VARIABLY RESISTIVE MEMORY DEVICE

(71) Applicant: SK hynix Inc., Icheon-si (KR)

(72) Inventors: Ki Won Lee, Icheon-si (KR); Jung Hyuk Yoon, Anyang-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/139,762

(22) Filed: Sep. 24, 2018

(65) Prior Publication Data
US 2019/0214084 A1    Jul. 11, 2019

(30) Foreign Application Priority Data

Jan. 10, 2018   (KR) .......................... 10-2018-0003413

(51) Int. Cl.
*G11C 13/00* (2006.01)
*H01L 27/24* (2006.01)
*G11C 8/06* (2006.01)

(52) U.S. Cl.
CPC ............ *G11C 13/0069* (2013.01); *G11C 8/06* (2013.01); *G11C 13/003* (2013.01); *G11C 13/004* (2013.01); *G11C 13/0023* (2013.01); *G11C 13/0026* (2013.01); *G11C 13/0028* (2013.01); *G11C 13/0033* (2013.01); *H01L 27/2463* (2013.01)

(58) Field of Classification Search
CPC .............. G11C 13/0069; G11C 13/004; G11C 13/0028; G11C 13/003; G11C 13/0026; H01L 27/2463

See application file for complete search history.

(56) References Cited

U.S. PATENT DOCUMENTS

| | | | |
|---|---|---|---|
| 10,210,927 B2 | 2/2019 | Yoon et al. | |
| 2011/0032746 A1* | 2/2011 | Maejima | G11C 13/0007 365/148 |
| 2011/0044090 A1* | 2/2011 | Terada | G11C 5/06 365/148 |
| 2019/0214078 A1* | 7/2019 | Kim | G11C 13/0026 |

FOREIGN PATENT DOCUMENTS

KR    1020150018454 A    2/2015

* cited by examiner

*Primary Examiner* — Tri M Hoang
(74) *Attorney, Agent, or Firm* — William Park & Associates Ltd.

(57) ABSTRACT

A variably resistive memory device may include a memory cell array and a control circuit block. The memory cell array may include a plurality of word lines, a plurality of bit lines and a plurality of memory cells. The memory cell array may also include memory layers connected between the word lines and the bit lines. The control circuit block may include a read/write circuit and a bit line control circuit. The read/write circuit may be configured to provide a selected bit line among the plurality of bit lines with a read voltage or a write voltage. The bit line control circuit may be connected with the read/write circuit and the bit lines to control a bit line voltage inputted into the selected bit line based on a location at which a selected memory cell is electrically connected to the selected bit line.

8 Claims, 10 Drawing Sheets

VARIABLY RESISTIVE MEMORY DEVICE

CROSS-REFERENCES TO RELATED APPLICATION

The present application claims priority under 35 U.S.C. § 119(a) to Korean application number 10-2018-0003413, filed on Jan. 10, 2018, in the Korean Intellectual Property Office, which is incorporated herein by reference in its entirety.

BACKGROUND

1. Technical Field

Various embodiments may generally relate to a variably resistive memory device, and more particularly, to a variably resistive memory device capable of preventing a fail caused by a peak current.

2. Related Art

A semiconductor memory device may include one or more memory cell arrays having a plurality of memory cells. Each of the memory cell arrays may be independently driven by a control circuit block. When the semiconductor memory device is driven, currents may be relatively high for memory cells adjacent to the control circuit block (hereinafter referred to as adjacent cells) as compared to for memory cells remotely located from the control circuit block (hereinafter referred to as remote cells). Particularly, in a cross point array structure using a phase changeable material as a switching element, a fail may be generated in an adjacent cell due to a peak current when a writing current is applied to the semiconductor memory device to store data.

SUMMARY

In accordance with an embodiment of the present disclosure, a variably resistive memory device may include a memory cell array and a control circuit block. The memory cell array may include a plurality of word lines, a plurality of bit lines, and a plurality of memory cells. The memory cell array may also include memory layers connected between the word lines and the bit lines. The control circuit block may include a read/write circuit and a bit line control circuit. The read/write circuit may be configured to provide a selected bit line among the plurality of bit lines with a read voltage or a write voltage. The bit line control circuit may be connected with the read/write circuit and the bit lines to control a bit line voltage inputted into the selected bit line based on a location at which a selected memory cell is electrically connected to the selected bit line.

Also in accordance with an embodiment of the present disclosure, a variably resistive memory device may include a memory cell array and a control circuit block. The memory cell array may include a plurality of word lines, a plurality of bit lines, and a plurality of memory cells. The memory cell array may also include memory layers connected between the word lines and the bit lines. The control circuit block may include a row switch block and a row switch drive circuit. The row switch block may include row switches configured to provide a selected word line with a word line voltage in response to a row selection signal. The row switch drive circuit may be configured to control a driving force of a row switch of the row switch block connected with the selected word line based on a position at which a selected memory cell is electrically connected to the selected word line.

Further in accordance with an embodiment of the present disclosure, a variably resistive memory device may include a memory cell array and a control circuit block connected with the memory cell array. The memory cell array may include a plurality of word lines, a plurality of bit lines and a plurality of memory cells. The memory cell array may also include memory layers connected between the word lines and the bit lines. Each memory cell of the memory cell array belongs to an adjacent cell group, a middle cell group, or a remote cell group based on an electronic distance along a bit line from the control circuit block to a location on the bit line where the memory cell is connected. The control circuit block may include a bit line control circuit and a word line control circuit. The bit line control circuit may be configured to drop a voltage and a current applied to a selected bit line when a selected memory cell connected to the selected bit line belongs to the adjacent cell group. The word line control circuit may be configured to control a voltage and a current applied to a selected word line to which the selected memory cell is connected.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

Various embodiments of the present teachings are described in detail with reference to the accompanying drawings. The drawings are schematic illustrations of various embodiments (and intermediate structures). As such, variations from the configurations and shapes of the illustrations as a result of, for example, manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as set forth by the appended claims.

The present teachings are described herein with reference to cross-section and/or plan illustrations of representative embodiments. However, presented embodiments of the present teachings should not be construed as limiting. Although a limited number of embodiments are presented, it will be appreciated by those skilled in the art that changes may be made to these embodiments without departing from the principles and spirit of the present teachings as claimed below.

Figure 1:
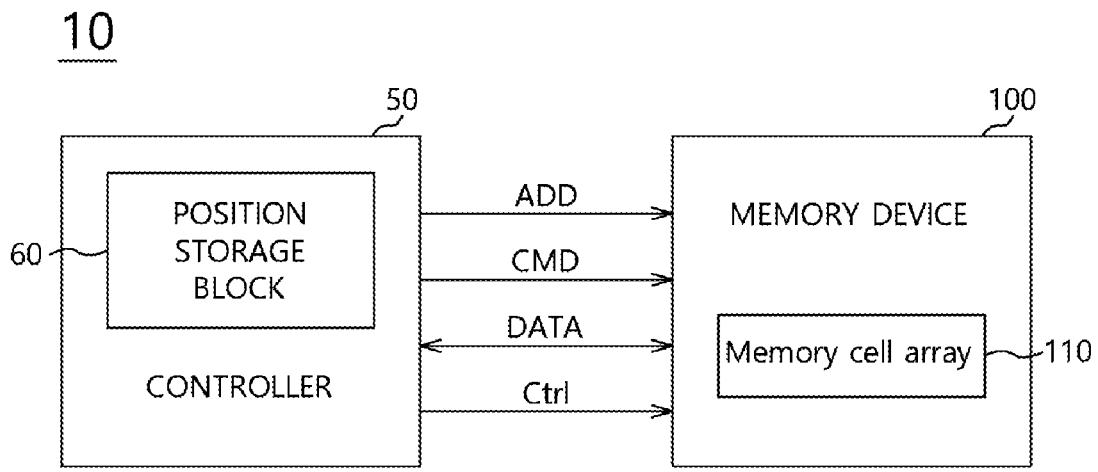
FIG. 1 shows a block diagram illustrating a variably resistive memory system in accordance with an embodiment of the present teachings.
Figure 2:
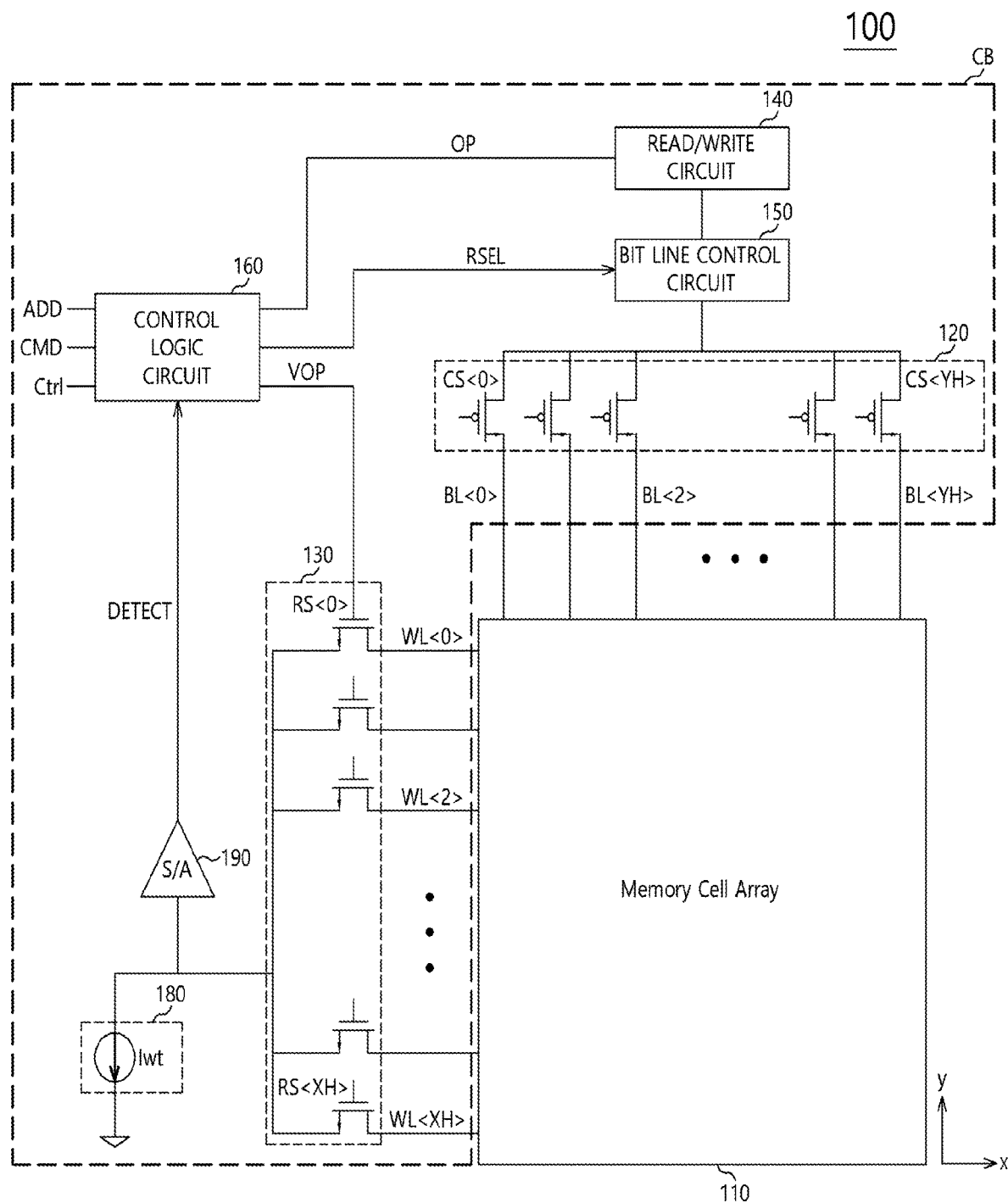
FIG. 2 shows a circuit diagram illustrating a variably resistive memory device in accordance with an example embodiment of the present teachings.

FIG. 1 shows a block diagram illustrating a variably resistive memory system in accordance with an embodiment, and FIG. 2 is a circuit diagram illustrating a variably resistive memory device in accordance with an embodiment.

Referring to FIG. 1, a variably resistive memory system 10 may include a controller 50 and a variably resistive memory device 100 including at least one memory cell array 110.

The controller 50 may be configured to provide the variably resistive memory device 100 with a command CMD, an address ADD, a control signal Ctrl, and data DATA for driving the variably resistive memory device 100. The controller 50 may include a position storage block 60. The position storage block 60 may be configured to store information for classifying a memory cell of the memory cell array 110 as an adjacent cell, a middle cell, or a remote cell in accordance with the address ADD provided to the variably resistive memory device 100.

Referring to FIG. 2, the variably resistive memory device 100 may include the memory cell array 110 and a control circuit block CB.

The memory cell array 110 may have a cross point type structure including a plurality of first signal lines, a plurality of second signal lines, and a plurality of memory cells. The memory cells may be connected between the first signal lines and the second signal lines. The first signal lines may include bit lines BL. The second signal lines may include word lines WL. Alternatively, the first signal lines may include the word lines WL, and the second signal lines may include the bit lines BL.

The word "connected," as used herein for some embodiments, can refer to first and second components that are in direct physical or electrical contact with one another. The word "connected," as used herein for other embodiments, can refer to the first and second components being in indirect physical or electrical contact with one another by virtue of a third and possibly additional components being disposed between the first and second components.

The control circuit block CB may include a column switch block 120, a row switch block 130, a read/write circuit 140, a bit line control circuit 150, a control logic circuit 160, a current supply circuit 180, and a sense amplifier 190.

Figure 3:
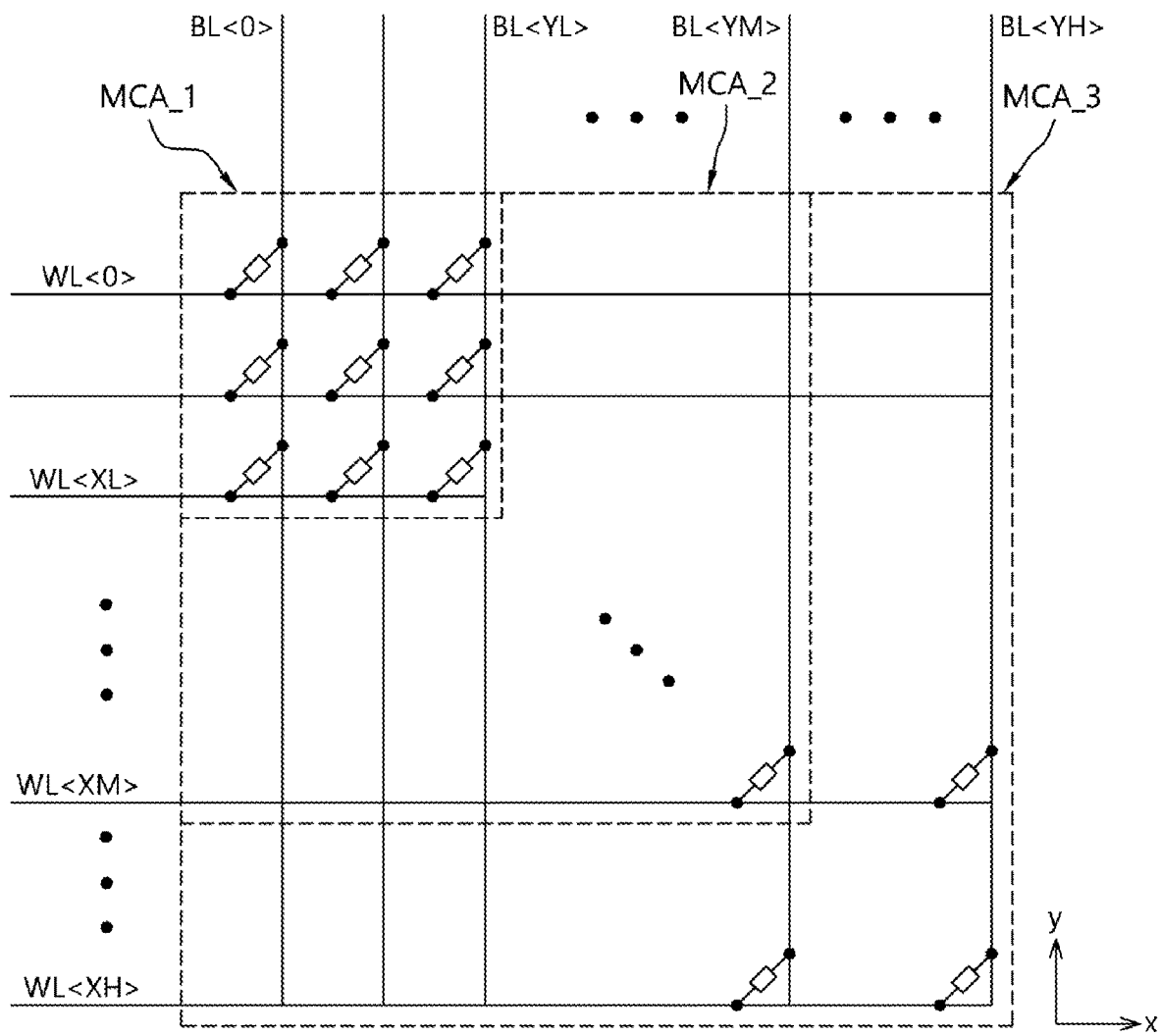
FIG. 3 shows a circuit diagram illustrating the memory cell array of FIG. 2.
Figure 4:
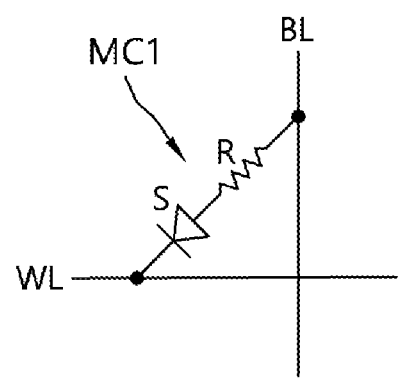
FIG. 4 shows a circuit diagram illustrating a memory cell in accordance with an embodiment of the present teachings.

FIG. 3 shows a circuit diagram illustrating the memory cell array 110 of FIG. 2 in detail, and FIG. 4 shows a circuit diagram illustrating a memory cell in accordance with example embodiments.

Referring to FIG. 3, the memory cell array 110 may include a plurality of word lines WL<0:XH>, a plurality of bit lines BL<0:YH>, and a plurality of memory cells MC.

The word lines WL<0:XH> may be spaced apart from each other by a uniform gap along an y-direction. The bit lines BL<0:YH> may be spaced apart from each other by a uniform gap along a x-direction. Thus, the word lines WL<0:XH> and the bit lines BL<0:YH> may be substantially perpendicular to each other. The memory cells MC may be arranged at intersection points between the word lines WL<0:XH> and the bit lines BL<0:YH>. The number of the word lines WL<0:H>, the number of bit lines BL<0:YH>, and the number of memory cells MC may vary in accordance with an integration degree of the memory device 100. The memory cell array 110 may have a two or three dimensional structure.

The control circuit block CB of FIG. 2 may be positioned adjacent to a zeroth word line WL<0> and a zeroth bit line BL<0>. Thus, memory cells, among all the memory cells MC, defined by the word lines WL<0:XL> and the bit lines BL<0:YL> may be defined as an adjacent cell group MCA_1. Memory cells defined by the word lines WL<XL+1:XM> and the bit lines BL<YL+1:YM> may be defined as a middle cell group MCA_2. Memory cells defined by the word lines WL<XM+1:XH> and the bit lines BL<YM+1:YH> may be defined as a remote cell group MCA_3. Here, XL, XM, XH, YL, YM and YH may be natural numbers. XM may be greater than XL and less than XH. YM may be greater than YL and less than YH. Position information of the adjacent cell group MCA_1, the middle cell group MCA_2, and the remote cell group MCA_3 may be stored in the position storage block 60 of the controller 50, shown in FIG. 1.

Referring to FIG. 4, a memory cell MC1 may include a selection element S and a variable resistor R. The selection element S may be connected with a word line WL. The variable resistor R may be connected between the selection element S and a bit line BL.

The selection element S may include a diode or a MOS transistor. Further, the selection element S may include an ovonic threshold switch (OTS) including a phase changeable memory layer. In some embodiments, the memory cell MC1 represents a single-bit memory cell. In other embodiments, the memory cell MC1 represents a multi-bit memory cell.

The variable resistor R may include a memory layer. The variable resistor R may have different resistance values dependent upon a voltage difference between the bit line BL and the word line WL. The variable resistor R may include a phase changeable layer or a resistance changeable layer. The phase changeable layer may include a compound including two elements such as GaSb, InSb, InSe, $Sb_2Te_3$, GeTe, etc., a compound including three elements such as GeSbTe, GaSeTe, InSbTe, $SnSb_2Te_4$, InSbGe, etc., a compound including four elements such as AgInSbTe, (GeSe)SbTe, GeSb(SeTe), $Te_{81}Ge_{15}Sb_2S_2$, etc.

The phase changeable layer may have an amorphous state having a relatively high resistance and a crystalline state having a relatively low resistance. The phase changeable layer may have phase varying based on Joule heat generated in accordance with a current amount and a cooling time.

Each of the memory cells may include a single-level cell configured to store one bit of data. The memory cell may have two resistance distributions in accordance with stored data. Alternatively, each of the memory cells may include a multi-level cell configured to store at least two bits of data. The memory cell may have four or eight resistance distributions in accordance with stored data.

Referring to FIG. 2, the column switch block 120 may be configured to select any one of the bit lines BL<0:YH> in response to a column selection signal CS<0:YH> provided by the control logic circuit 160. For example, the column switch block 120 may include a plurality of column switches connected with the bit lines BL<0:YH> and driven in response to the column selection signal CS<0:YH>. In example embodiments, a column switch may include a PMOS transistor.

The row switch block 130 may be configured to select any one of the word lines WL<0:XH> in response to a row selection signal RS<0:XH> provided by the control logic circuit 160. For example, the row switch block 130 may include a plurality of row switches connected with the word lines WL<0:XH> and driven in response to the row selection signal RS<0:XH>. In example embodiments, a row switch may include an NMOS transistor.

The read/write circuit 140 may be configured to receive a drive control signal 'OP' provided by the control logic circuit 160. The read/write circuit 140 may be configured to apply a drive voltage to the bit lines so that the variably resistive memory device 100 may perform data read/write operations. For example, the read/write circuit 140 may include a write driver and a read driver.

The write driver may be configured to apply a write voltage to a selected bit line in response to a write command provided by the controller 50. Thus, the data DATA provided by the controller 50 may be stored in a selected memory cell. In some embodiments, the write driver may include various circuits used in variably resistive memory devices and non-volatile memory devices.

When performing a writing operation, a resistance of the variable resistor R in the memory cell MC1 of the memory cell array 110 may vary in accordance with levels of the data DATA. When the variable resistor R includes the phase changeable layer, the variable resistor R may represent a set state and a reset state in accordance with the applied write voltage.

The read driver may be configured to apply a read voltage to a selected bit line in response to a read command. Thus, the data DATA in a selected memory cell may be read. For example, when the variable resistor R includes a phase changeable layer, the read voltage may have a voltage level for maintaining a crystalline state of the phase changeable layer.

The bit line control circuit 150 may be connected between the read/write circuit 140 and the column switch block 120 to control a voltage (current) applied to the bit lines BL<0:YH>.

Figure 5:
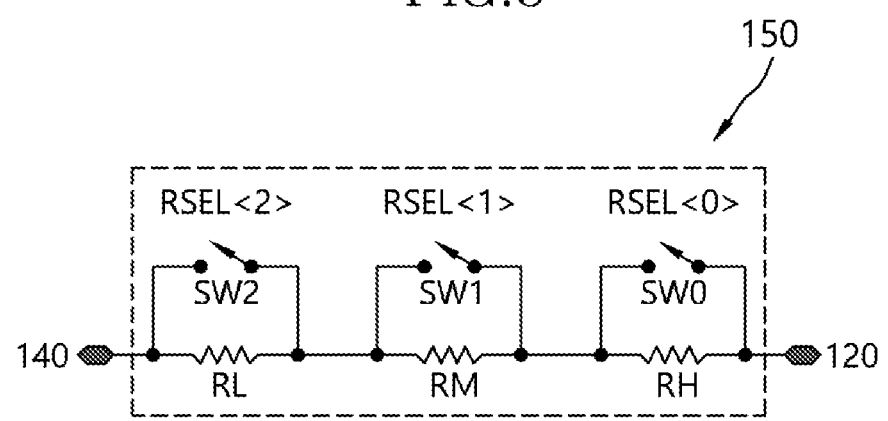
FIG. 5 shows a circuit diagram illustrating a bit line control circuit in accordance with an embodiment of the present teachings.

FIG. 5 shows a circuit diagram illustrating a bit line control circuit 150 in accordance with an embodiment.

Referring to FIG. 5, the bit line control circuit 150 may include a low resistance network RL, a middle resistance network RM, and a high resistance network RH connected in series. Any one of the low resistance network RL, the middle resistance network RM, and the high resistance network RH may be selectively connected between the read/write circuit 140 and the column switch block 120. In other embodiments multiple resistance networks may be connected between the read/write circuit 140 and the column switch block 120 simultaneously. Further, the low resistance network RL, the middle resistance network RM, and the high resistance network RH may be connected in series in an order different from the order shown in FIG. 5. The bit line control circuit 150 may include switches SW2, SW1, and SW0 connected in parallel between both ends of the low resistance network RL, the middle resistance network RM, and the high resistance network RH, respectively. The switches SW0, SW1, and SW2 may be driven in response to a resistance selection signal RSEL<0:2>.

The low resistance network RL, the middle resistance network RM, and the high resistance network RH may include a single resistor. Alternatively, the low resistance network RL, the middle resistance network RM, and the high resistance network RH may include a plurality of resistors connected with each other. The low resistance network RL may have a resistance lower than that of the middle resistance network RM. The resistance of the middle resistance network RM may be lower than that of the high resistance network RH. Further, the resistances of the low resistance network RL, the middle resistance network RM, and the high resistance network RH may be capable of offsetting and removing the peak current temporarily generated when a voltage or a current is applied to the bit line. Also, the resistances of the low resistance network RL, the middle resistance network RM, and the high resistance network RH might not have influence on whole program (write) operations.

For example, to decrease the peak current when applying a write voltage to a bit line of the adjacent cell group MCA_1, a current/voltage path passing through the high resistance network RH may be established. For instance, when a zeroth resistance selection signal RSEL<0> may be disabled to a low level and first and second resistance selection signals RSEL<1> and RSEL<2> may be enabled to a high level, the current/voltage path passing through the high resistance network RH may be established. Therefore, the high resistance network RH may offset and remove the peak current applied to the bit line BL<0:YL> in the adjacent cell group MCA_1.

When applying a write voltage to a bit line of the middle cell group MCA_2, the first resistance selection signal RSEL<1> may be disabled to a low level and the zeroth and second resistance selection signals RSEL<0> and RSEL<2> may be enabled to a high level to establish a current/voltage path passing through the middle resistance network RM. Therefore, the middle resistance network RM may stabilize the write voltage applied to the bit line BL<YL+1:YM> in the middle cell group MCA_2. The stabilized write voltage may then be transmitted to the bit line.

When applying a voltage to the remote cell group MCA_3, the second resistance selection signal RSEL<2> may be disabled to a low level and the zeroth and first resistance selection signals RSEL<0> and RSEL<1> may be enabled to a high level to establish a current/voltage path passing through the low resistance network RL. Therefore, the write voltage applied to the bit line BL<YM+1:YH> in the remote cell group MCA_3 may pass through the low resistance network RL so that the write voltage may be stabilized.

Figure 6:
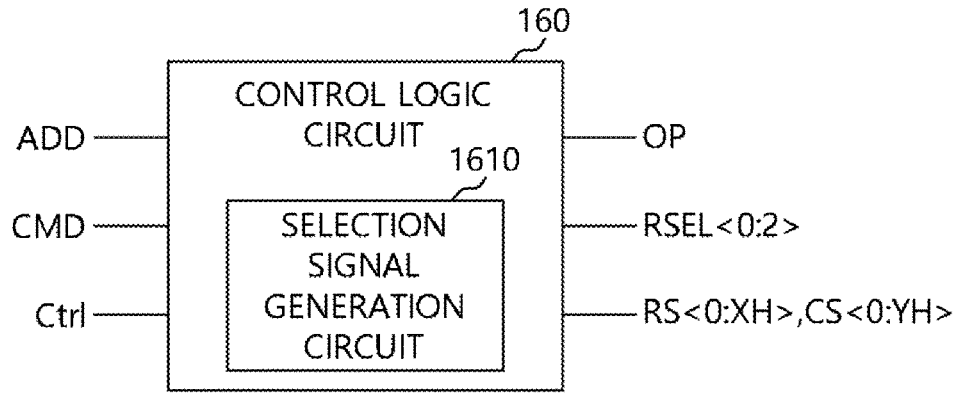
FIG. 6 shows a block diagram illustrating a control logic circuit in accordance with an embodiment of the present teachings.
Figure 7:
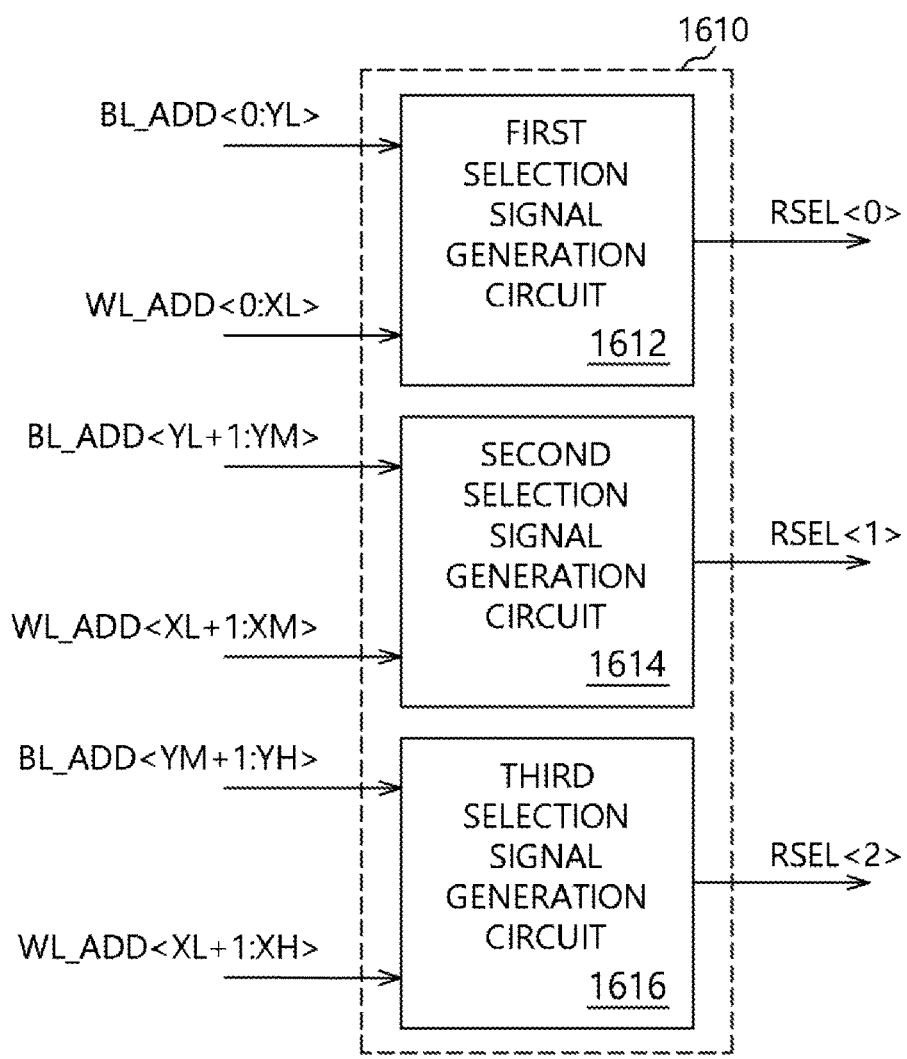
FIG. 7 shows a circuit diagram illustrating the selection signal generation circuit of FIG. 6.

FIG. 6 shows a block diagram illustrating the control logic circuit 160 in accordance with some embodiments, and FIG. 7 shows a circuit diagram illustrating a selection signal generation circuit in FIG. 6.

Referring to FIGS. 2 and 6, the control logic circuit 160 may receive the address ADD, the command CMD, and the control signal Ctrl from the controller 50 to generate the row selection signal RS<0:XH>, the column selection signal CS<0:YH>, the drive control signal 'OP' for driving the read/write circuit 140, and the zeroth to second resistance selection signals RSEL<0:2>.

In some embodiments, the control logic circuit 160 may include a selection signal generation circuit 1610 configured to generate the zeroth to second resistance selection signals RSEL<0:2>.

Referring to FIG. 7, the selection signal generation circuit 1610 may include a first selection signal generation circuit 1612, a second selection signal generation circuit 1614, and a third selection signal generation circuit 1616.

The first selection signal generation circuit 1612 may receive an adjacent bit line address BL_ADD<0:YL> and an adjacent word line address WL_ADD<0:WL> to generate the zeroth resistance selection signal RSEL<0>. For example, when the adjacent bit line address BL_ADD<0:YL> and the adjacent word line address WL_ADD<0:XL> is enabled, the first selection signal generation circuit 1612 may generate the zeroth resistance selection signal RSEL<0> disabled to a low level.

The second selection signal generation circuit 1614 may receive a middle bit line address BL_ADD<YL+1:YM> and a middle word line address WL_ADD<XL+1:XM> to generate the first resistance selection signal RSEL<1>. For example, when the middle bit line address BL_ADD<YL+1:YM> and the middle word line address WL_ADD<XL+1:XM> is enabled, the second selection signal generation circuit 1614 may generate the first resistance selection signal RSEL<1> disabled to a low level.

The third selection signal generation circuit 1616 may receive a remote bit line address BL_ADD<YM+1:YH> and a remote word line address WL_ADD<XM+1:XH> to generate the second resistance selection signal RSEL<2>. For example, when the remote bit line address BL_ADD<YM+1:YH> and the remote word line address WL_ADD<XM+1:XH> is enabled, the third selection signal generation circuit 1616 may generate the second resistance selection signal RSEL<2> disabled to a low level.

In some embodiments, the bit line addresses may be classified as an adjacent bit line address BL_ADD<0:YL>, a middle bit line address BL_ADD<YL+1:YM>, or a remote bit line address BL_ADD<YM+1:YH> based on the information in the position storage block 60 of the controller 50. Further, the word line addresses may be classified as an adjacent word line address WL_ADD<0:XL>, a middle word line address WL_ADD<XL+1:XM>, or a remote word line address WL_ADD<XM+1:XH> based on the information in the position storage block 60 of the controller 50.

In example embodiments, the first to third selection signal generation circuits 1612, 1614, and 1616 may include a logic circuit configured to perform an NAND operation or a similar operation.

Referring to FIG. 2, the current supply circuit 180 may be connected with the row switch block 130 to control a voltage level applied to the word line WL<0:XH>.

The sense amplifier 190 may be connected with the row switch block 130 to sense a current amount flowing through the selected memory cell MC. The sense amplifier 190 may provide the control logic circuit 160 with sensed results DETECT.

The variably resistive memory device 100 may include the bit line control circuit 150. The bit line control circuit 150 may be configured to reduce the peak current flowing into the bit line BL<0:YH> and is located between the column switch block 120, connected to the selected bit line, and the read/write circuit 140.

The bit line control circuit 150 may include the high resistance network RH corresponding to the adjacent cell group MCA_1, the middle resistance network RM corresponding to the middle cell group MCA_2, and the low resistance network RL corresponding to the remote cell group MCA_3.

When the adjacent cell group MCA_1 is selected, the high resistance network RH may reduce the peak voltage and the peak current temporarily applied when the memory cell is turned-on.

Similarly, when the middle cell group MCA_2 and the remote cell group MCA_3 are selected, the middle resistance network RM and the low resistance network RL, respectively, may stabilize the peak voltage and the peak current temporarily applied when the memory cell may be turned-on.

Figure 8:
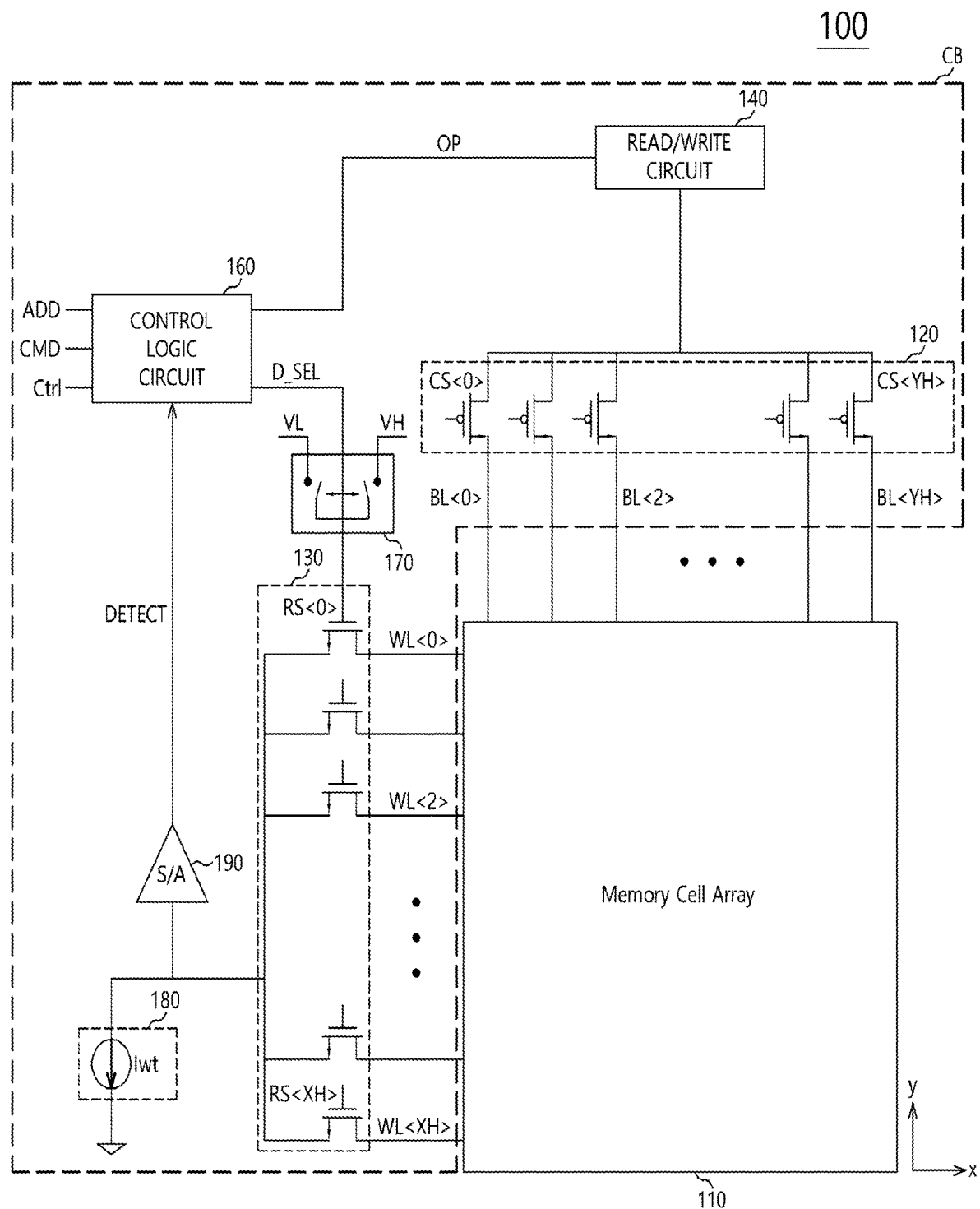
FIG. 8 shows a block diagram illustrating a variably resistive memory device in accordance with an embodiment of the present teachings.
Figure 9:
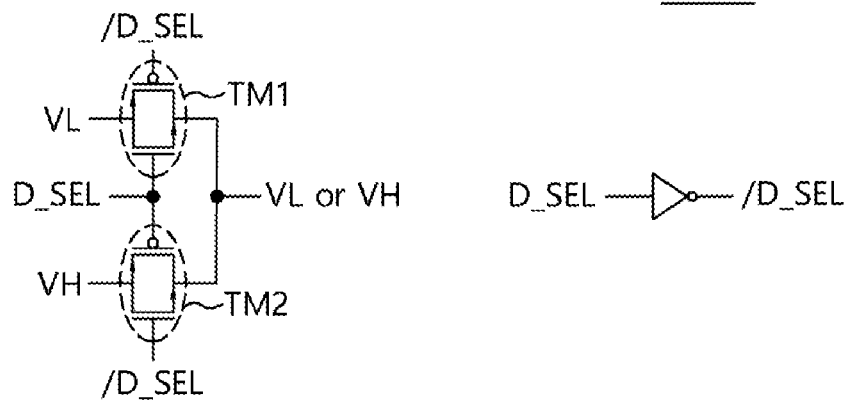
FIG. 9 shows a circuit diagram illustrating the row switch drive circuit of FIG. 8.
Figure 10:
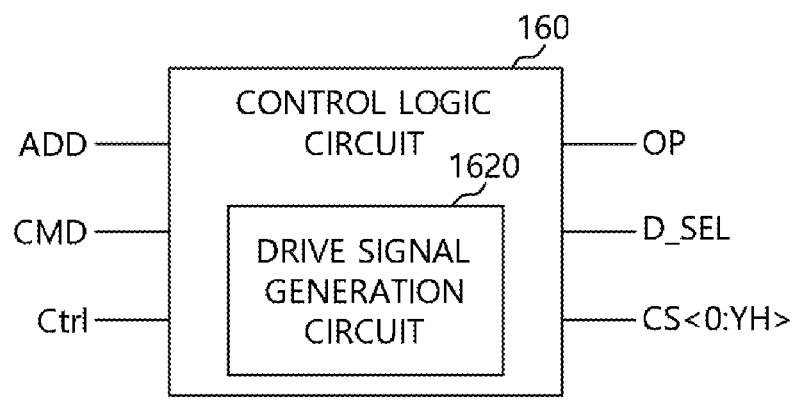
FIG. 10 shows a block diagram illustrating the control logic circuit of FIG. 8.
Figure 11:
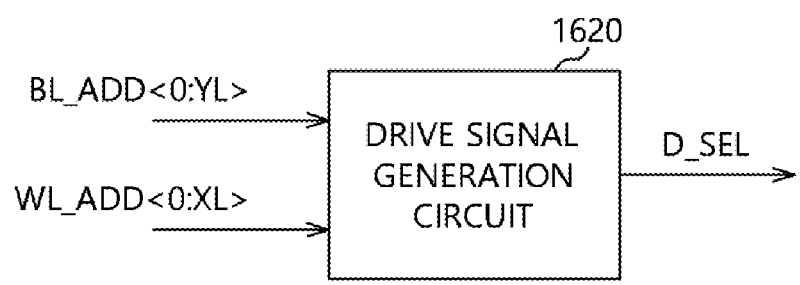
FIG. 11 shows a block diagram illustrating the drive signal generation circuit of FIG. 10.

FIG. 8 shows a block diagram illustrating a variably resistive memory device in accordance with some embodiments. FIG. 9 shows a circuit diagram illustrating a row switch drive circuit of FIG. 8. FIG. 10 shows a block diagram illustrating a control logic circuit in FIG. 9, and FIG. 11 shows a block diagram illustrating a drive signal generation circuit of FIG. 10.

Referring to FIG. 8, a variably resistive memory device 100 may include a memory cell array 110 and a control circuit block CB.

The control circuit block CB may include a column switch block 120, a row switch block 130, a read/write circuit 140, a control logic circuit 160, a row switch drive circuit 170, a current supply circuit 180, and a sense amplifier 190.

The memory cell array 110, the column switch block 120, the row switch block 130, the read/write circuit 140, the current supply circuit 180, and the sense amplifier 190 of the control circuit block CB shown in FIG. 8 may be substantially the same as the memory cell array 110, the column switch block 120, the row switch block 130, the read/write circuit 140, the current supply circuit 180, and the sense amplifier 190 of the control circuit block CB, respectively, shown in FIG. 2. Therefore, repeated descriptions of the memory cell array 110, the column switch block 120, the row switch block 130, the read/write circuit 140, the current supply circuit 180, and a sense amplifier 190 of the control circuit block CB are omitted for brevity.

The row switch drive circuit 170 may be connected between the control logic circuit 160 and the row switch block 130. The row switch drive circuit 170 may provide the row switch block 130 with a first voltage VL or a second voltage VH in response to a drive signal D_SEL provided by the control logic circuit 160.

The first voltage VL may have a voltage level lower than that of the second voltage VH. However, the first voltage VL and the second voltage VH may function to turn-on an NMOS transistor in the row switch block 130.

Referring to FIG. 9, the row switch drive circuit 170 may include a first transfer gate TM1, configured to transfer the first voltage VL, and a second transfer gate TM2, configured to transfer the second voltage VH. The first and second transfer gates TM1 and TM2 may be selectively driven in response to the drive signal D_SEL and a reverse drive signal /D_SEL to transfer the first voltage VL or the second voltage VH to the row switch block 130. For example, when the drive signal D_SEL having a high level is inputted, the row switch drive circuit 170 may provide the row switch block 130 with the first voltage VL. In contrast, when the drive signal D_SEL having a low level is inputted, the row switch drive circuit 170 may provide the row switch block 130 with the second voltage VH.

Referring to FIG. 10, the control logic circuit 160 may receive the address ADD, the command CMD, and the control signal Ctrl from the controller 50 to generate the column selection signal CS<0:YH>, the drive control signal OP for driving the read/write circuit 140, and the drive signal D_SEL for driving the row switch drive circuit 170. The control logic circuit 160 may include a drive signal generation circuit 1620 configured to generate the drive signal D_SEL.

Referring to FIG. 11, the drive signal generation circuit 1620 may receive an adjacent bit line address BL_ADD<0:YL> and an adjacent word line address WL_ADD<0:WL>. For example, when the adjacent bit line address BL_ADD<0:YL> and the adjacent word line address WL_ADD<0:XL> are enabled to a high level, the drive signal generation circuit 1620 may generate the drive signal D_SEL having the high level. For example, the drive signal generation circuit 1620 may include a logic circuit configured to perform an AND calculation.

When the adjacent bit line address BL_ADD<0:YL> and the adjacent word line address WL_ADD<0:XL> for defining the adjacent cell group MCA_1 is enabled, the drive signal generation circuit 1620 may determine a memory cell in the adjacent cell group MCA_1 to be selected to output the drive signal D_SEL having the high level. Thus, the row switch drive circuit 170 may output the first voltage VL as the row selection signal RS<0:XL> in response to the drive signal D_SEL having the high level.

Therefore, the row switches connected to the word lines in the adjacent cell group MCA_1 may be turned-on by the first voltage VL. Because the NMOS transistor corresponding to the row switch may receive the first voltage VL as a gate voltage lower than the second voltage VH, the NMOS transistor may be operated by a driving force lower than that for operating the NMOS transistor using the second voltage VH. Thus, when a peak current flows from the current supply circuit 180, the peak current may be reduced because the row switch may be operated using the relatively low driving force.

When the word line WL<XL+1:XH> outside a word line in the adjacent cell group MCA_1 is driven, the drive signal generation circuit 1620 may output the low drive signal D_SEL. Thus, the row switch drive circuit 170 may provide the relatively high second voltage VH as the row selection signal RS<XL+1:XH> in response to the low drive signal D_SEL. The row switches for driving the middle cell group MCA_2 and the remote cell group MCA_3 may be driven by a relatively high driving force using the second voltage VH, which is higher than the first voltage VL. As a result, a sufficient amount of the word line voltage may be supplied to the corresponding word line.

Figure 12:
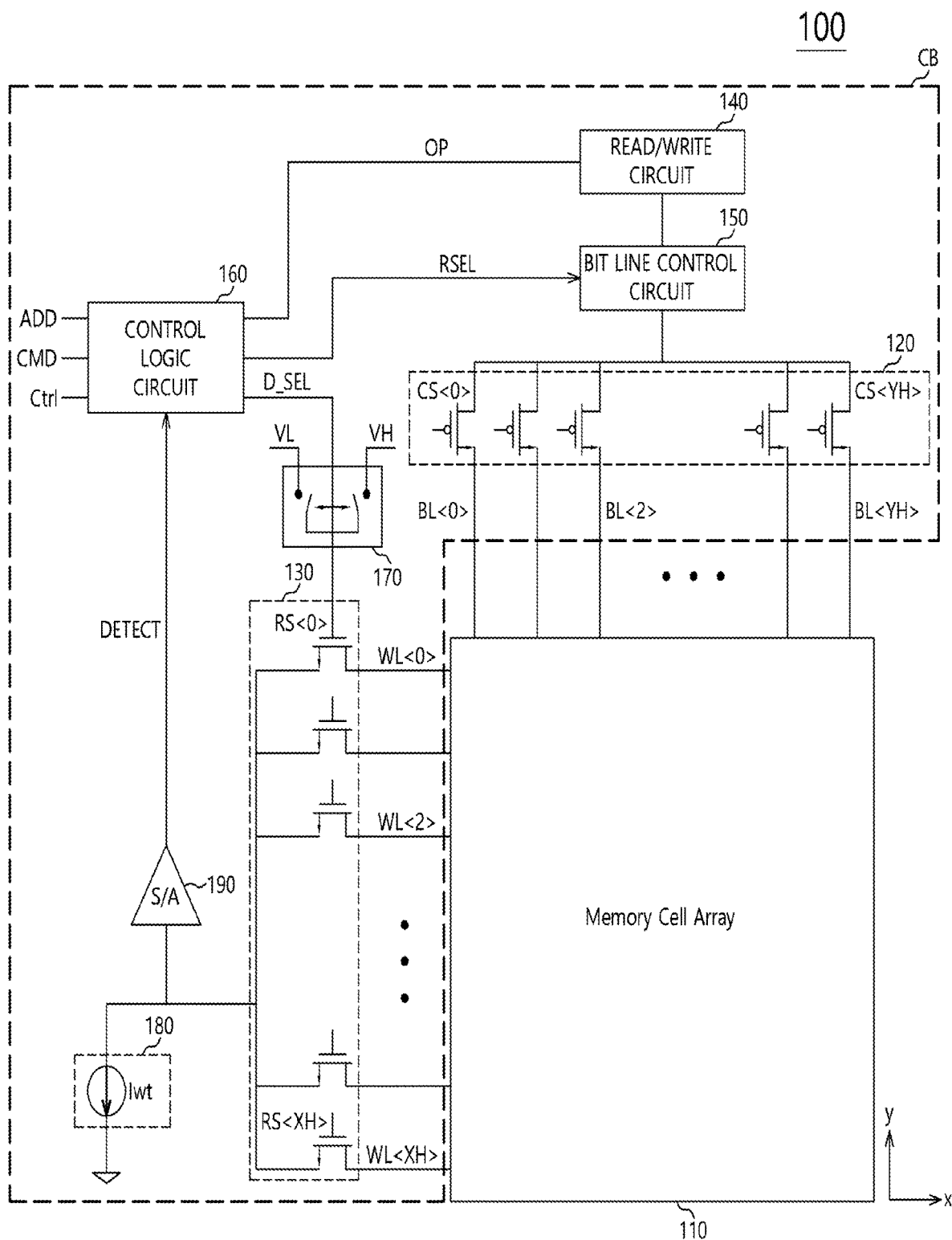
FIG. 12 shows a block diagram illustrating a variably resistive memory device in accordance with an example embodiment of the present teachings.
Figure 13:
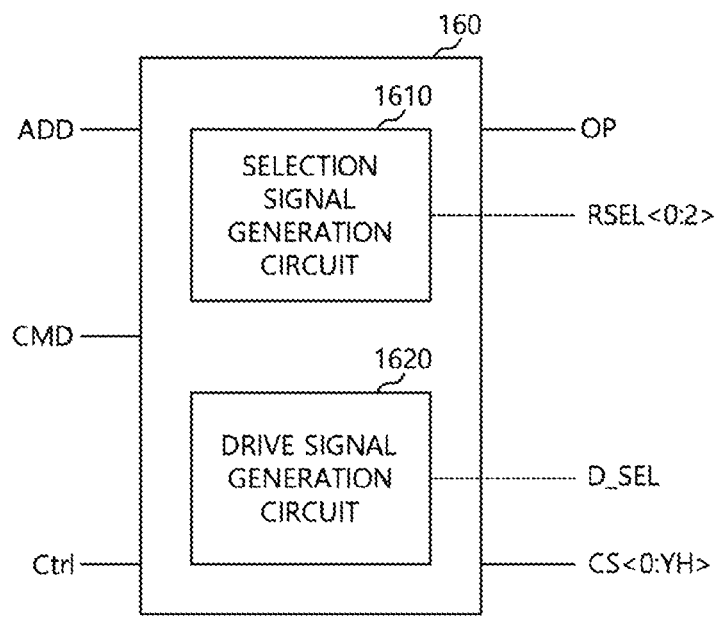
FIG. 13 shows a block diagram illustrating the control logic circuit in FIG. 12.

FIG. 12 shows a block diagram illustrating a variably resistive memory device in accordance with some embodiments, and FIG. 13 shows a block diagram illustrating a control logic circuit in FIG. 12.

Referring to FIG. 12, a variably resistive memory device 100 may have configurations substantially the same as those in FIGS. 2 and 8 except for a control circuit block CB.

The control circuit block CB of FIG. 12 may include a column switch block 120, a row switch block 130, a read/write circuit 140, a bit line control circuit 150, a control logic circuit 160, a row switch drive circuit 170, a current supply circuit 180, and a sense amplifier 190. That is, the control circuit block CB of the variably resistive memory device 100 of FIG. 12 may include the bit line control circuit 150, configured to control the voltage (current) applied to the bit line BL<0:YH> in accordance with the position of the memory cell, and include the row switch drive circuit 170 corresponding to a word line control circuit configured to control the voltage (current) applied to the word line WL<0:XH>.

Referring to FIG. 13, the control logic circuit 160 may include the selection signal generation circuit 1610 and the drive signal generation circuit 1620. The selection signal generation circuit 1610 may have a configuration substantially the same as described for FIG. 7. The drive signal generation circuit 1620 may have a configuration substantially the same as described for FIG. 11.

In some embodiments, because the variably resistive memory device 100 may include the bit line control circuit 150 and the row switch drive circuit 170, the voltage (current) of the bit line and the voltage (current) of the word line may be simultaneously controlled when a memory cell in the adjacent cell group MCA_1 is selected. Thus, when the memory cell MC in the adjacent cell group MCA_1 is selected, the peak current generated in the adjacent cell region may be effectively reduced.

For example, when the memory cell MC in the adjacent cell group MCA_1 is selected, the bit line control circuit 150 may be driven to connect the high resistance network RH with the corresponding bit line. Thus, the voltage (current) applied to the corresponding bit line may be reduced by the high resistance network RH. Simultaneously, because the word line of the selected memory cell MC may be driven by the first voltage VL, the word line may be driven by the relatively low driving force. Therefore, although the voltage of the word line may be decreased to a relatively low level to generate the peak current, a voltage difference ΔV between the bit line and the word line may not be sharply increased.

Figure 14:
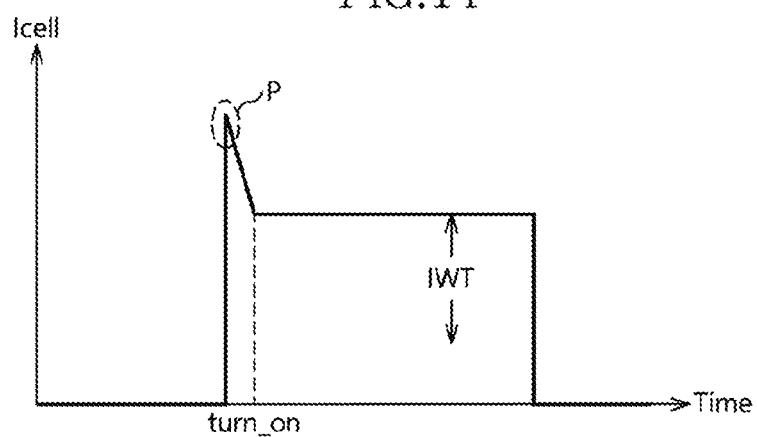
FIG. 14 shows a graph showing a cell current by time lapse in a variably resistive memory device in accordance with an example embodiment of the present teachings.
Figure 15:
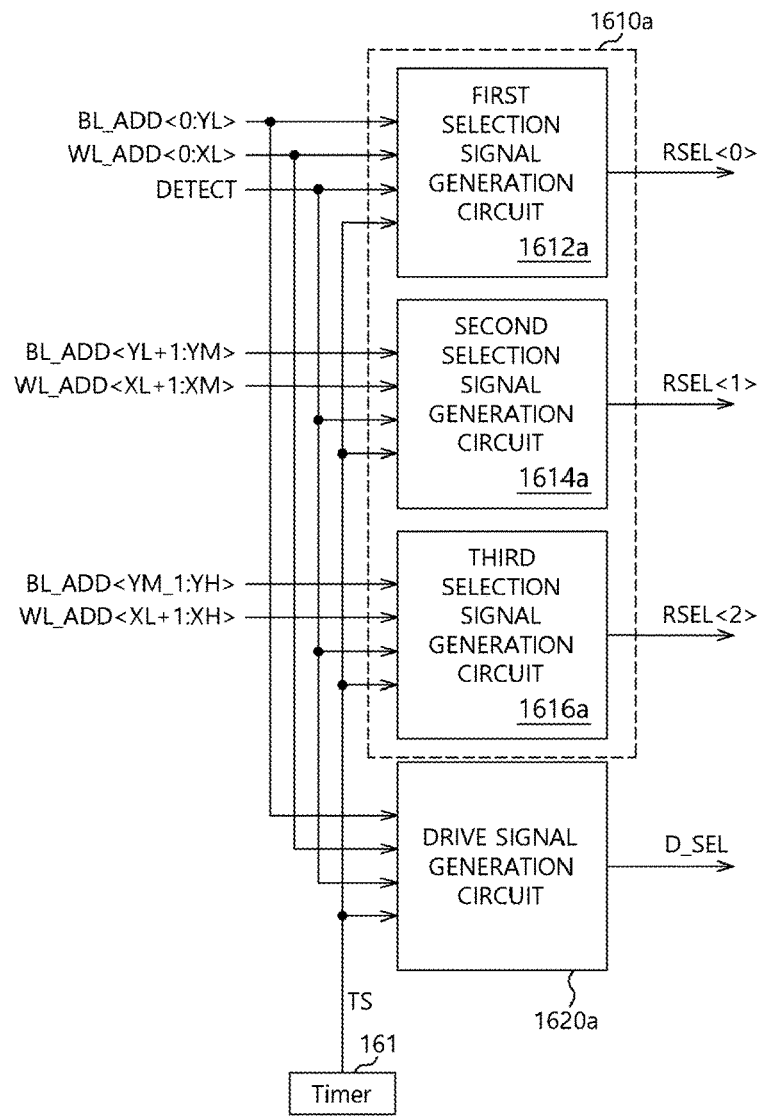
FIG. 15 shows a block diagram illustrating a control logic circuit in accordance with an example embodiment of the present teachings.

FIG. 14 shows a graph illustrating a cell current by time lapse in a variably resistive memory device in accordance with some embodiments, and FIG. 15 shows a block diagram illustrating a control logic circuit in accordance with some embodiments.

Referring to FIG. 14, when a voltage difference between the bit line and the word line in a selected variably resistive memory cell is generated, the selected variably resistive memory cell may be turned-on. Further, a write current Iwt in accordance with set data may be applied to the bit line. However, when the memory cell is selected, a peak current P may be temporarily applied. The peak current P may be undesirably high in the memory cell of the adjacent cell group MCA_1.

In some embodiments, the voltage/current applied to the bit line and the word line in the adjacent cell group MCA_1 may be controlled during a transient time when the peak current may be generated.

In some embodiments, a turn-on timing of the memory cell for controlling the voltage/current applied to the bit line and the word line in the adjacent cell group MCA_1, may be controlled based on the sensed results DETECT of the sense amplifier 190.

Referring to FIG. 15, a control logic circuit 160a may include a selection signal generation circuit 1610a and a drive signal generation circuit 1620a.

The selection signal generation circuit 1610a may include a first selection signal generation circuit 1612a, a second selection signal generation circuit 1614a, and a third selection signal generation circuit 1616a.

The first selection signal generation circuit 1612a may receive the adjacent bit line address BL_ADD<0:YL>, the adjacent word line address WL_ADD<0:XL>, the sensed results DETECT, and a time control signal TS to generate the zeroth resistance selection signal RSEL<0>.

The second selection signal generation circuit 1614a may receive the middle bit line address BLADD<YL+1:YM>, the middle word line address WL_ADD<XL+1:XM>, the sensed results DETECT, and the time control signal TS to generate the first resistance selection signal RSEL<1>.

The third selection signal generation circuit 1616a may receive the remote bit line address BL_ADD<YM+1:YH>, the remote word line address WL_ADD<XM+1:XH>, the sensed results DETECT, and the time control signal TS to generate the second resistance selection signal RSEL<2>.

The sensed results DETECT may be provided by the sense amplifier 190. The time control signal TS may be provided by a timer circuit 161. The timer circuit 161 may include generally used timing circuits.

When a corresponding bit line address, a corresponding word line address, the sensed results DETECT outputted from the sense amplifier 180, and the time control signal TS are enabled, the first to third selection signal generation circuits 1612a, 1614a, and 1616a may selectively enable the resistance selection signal RSEL<0:2>. Thus, the bit line control circuit 150 may control the voltage applied to the bit line BL<0:YH> for a predetermined time in accordance with the position of the selected memory cell.

The word "predetermined" as used herein with respect to a parameter, such as a predetermined time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The drive signal generation circuit 1620a may receive the adjacent bit line address BL_ADD<0:YL>, the adjacent word line address WL_ADD<0:XL>, the sensed results DETECT, and the time control signal TS. When the adjacent bit line address BL_ADD<0:YL>, the adjacent word line address WL_ADD<0:XL>, the sensed results DETECT, and the time control signal TS are enabled, the drive signal generation circuit 1620a may generate the drive signal D_SEL for outputting the first voltage VL as the low voltage. That is, when the turn-on timing of the memory cell is detected from the sensed results DETECT outputted from the sense amplifier 190, the drive signal D_SEL may be enabled for a time set by the timer circuit 161. Thus, the voltage applied to the word line WL<0:XH> may be controlled for the predetermined time in accordance with the position of the memory cell when the memory cell is turned-on.

In some embodiments, the set time of the timer circuit 161 may be set based on the time when the peak current may be generated. Therefore, the bit line voltage (current) and the word line voltage (current) are controlled only when and immediately after the memory cell MC is turned-on. As a result, the bit line voltage (current) and the word line voltage (current) may be controlled during the time when a peak current would otherwise be generated. Regardless, a sufficient amount of write current is provided for the write operation.

Figure 16:
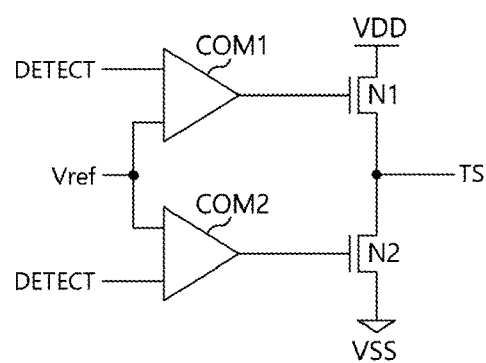
FIG. 16 shows a circuit diagram illustrating the timer of FIG. 15.

FIG. 16 shows a circuit diagram illustrating the timer circuit 161 of FIG. 15.

Referring to FIG. 16, the timer circuit 161 may include a first comparator COM1, a second comparator COM2, a first switch N1, and a second switch N2.

The first comparator COM1 may be configured to receive the sensed results DETECT as a first input and a reference voltage Vref as a second input. The second comparator COM2 may be configured to receive the reference voltage Vref as a first input and the sensed results DETECT as a second input. For an embodiment, the reference voltage Vref may correspond to a normal write voltage.

The first switch N1 may receive an output signal from the first comparator COM1. The second switch N2 may receive an output signal from the second comparator COM2.

When the sensed results DETECT are higher than the normal write voltage, the first comparator COM1 may generate the output signal having a high level. The first switch N1 may be turned-on to output a drive voltage VDD as the time control signal TS corresponding to a peak current detection signal.

When the sensed results DETECT are lower than the normal write voltage, the second comparator COM2 may generate the output signal having a high level. The second switch N2 may be turned-on to output a ground voltage Vss as the time control signal TS. Thus, when the sensed results DETECT are no less than the normal write voltage, the voltage (current) applied to the bit line and/or the word line may be controlled by the pulsed time control signal TS during the time the peak current P would be generated.

Further, in some embodiments, the timer circuit 161 may set the enabled sections of the resistance selection signal RSEL<0:2> and the drive signal D_SEL. Alternatively, the resistance selection signal RSEL<0:2> and the drive signal D_SEL may be enabled during the time the sensed results DETECT are enabled.

According to some embodiments, when the variably resistive memory cell is turned-on, the voltage (current) applied to the bit line and the word line in the adjacent cell group may be selectively or simultaneously controlled. Therefore, fails caused by a peak current temporarily generated when the memory cell is turned-on may be reduced.

The above-described embodiments of the present teachings are intended to illustrate and not to limit the present teachings. Various alternative and equivalent embodiments are possible. The present teachings are not limited by the embodiments described herein. Nor are the present teachings limited to any specific type of semiconductor device. Other additions, subtractions, or modifications are possible in accordance with the present disclosure and are intended to fall within the scope of the appended claims.

What is claimed is:

1. A variably resistive memory device comprising:
    a control circuit block; and
    a memory cell array connected with the control circuit block, the memory cell array comprising:
        a plurality of word lines;
        a plurality of bit lines; and
        a plurality of memory cells, wherein each memory cell of the memory cell array is connected between a word line of the plurality of word lines and a bit line of the plurality of bit lines, and wherein each memory cell of the memory cell array belongs to an adjacent cell group, a middle cell group, or a remote cell group based on an electronic distance along a bit line from the control circuit block to a location on the bit line where the memory cell is connected, and wherein the control circuit block comprises:
- a bit line control circuit including a low resistance network; a middle resistance network connected with the low resistance network, the middle resistance network having a resistance higher than the resistance of the low resistance network; and a high resistance network connected with the middle resistance network, the high resistance network having a resistance higher than the resistance of the middle resistance network, and the high resistance network being selectively connected between a read/write circuit and a column switch block based on the selected memory cell belonging to the adjacent cell group; and
- a word line control circuit configured to control a voltage and a current applied to a selected word line to which the selected memory cell is connected.

2. The variably resistive memory device of claim 1, wherein the control circuit block further comprises:
- the column switch block electrically connected with the plurality of bit lines to select any of the plurality of bit lines based on a column selection signal;
- a row switch block electrically connected with the plurality of word lines to select any of the plurality of word lines based on a row selection signal;
- the read/write circuit connected with the plurality of bit lines to provide the selected bit line with a write/read voltage;
- a sense amplifier connected with the plurality of word lines to detect a current flowing through the selected memory cell; and
- a control logic circuit to generate the column selection signal, the row selection signal, a signal for controlling the bit line control circuit, and a signal for controlling the word line control circuit,
wherein the signal for controlling the bit line control circuit and the signal for controlling the word line control circuit are generated in response to a bit line address and a word line address.

3. The variably resistive memory device of claim 1, wherein the high resistance network is selectively connected with the bit line control circuit when the selected memory cell belongs to the adjacent cell group, the middle resistance network is selectively connected with the bit line control circuit when the selected memory cell belongs to the middle cell group, and the low resistance network is selectively connected with the bit line control circuit when the selected memory cell belongs to the remote cell group is selected.

4. The variably resistive memory device of claim 2, wherein the word line control circuit selectively outputs one of a first voltage and a second voltage higher than the first voltage in response to the signal for controlling the word line control circuit.

5. The variably resistive memory device of claim 4, wherein the word line control circuit outputs the first voltage as the row selection signal when the selected memory cell belongs to the adjacent cell group, and the word line control circuit outputs the second voltage as the row selection signal when the selected memory cell belongs to the middle cell group or the remote cell group.

6. The variably resistive memory device of claim 2, wherein the control logic circuit comprises:
- a selection signal generation circuit, wherein the selection signal generation circuit receives at least one of a bit line address and a word line address for the adjacent cell group, a bit line address and a word line address for the middle cell group, and a bit line address and a word line address for the remote cell group to generate a signal for controlling the bit line control circuit; and
- a drive signal generation circuit, wherein the drive signal generation circuit receives the bit line address and the word line address for the adjacent cell group to generate the signal for controlling the word line control circuit.

7. The variably resistive memory device of claim 2, wherein, when the selected memory cell belongs to the adjacent cell group, sensed results of the sense amplifier are provided to the control logic circuit, and based on the sensed results, the control logic circuit enables the signal for controlling the bit line control circuit and the signal for controlling the word line control circuit during a time interval after the sensed results are provided to the control logic circuit.

8. The variably resistive memory device of claim 7, wherein the control logic circuit comprises:
- a timer configured to generate a time control signal enabled during a time span;
- a selection signal generation circuit configured to receive a bit line addresses and a word line addresses for the adjacent, middle and remote cell groups, the sensed results, and the time control signal to generate the signal for controlling the bit line control circuit; and
- a drive signal generation circuit configured to receive the bit line address and the word line address for the adjacent cell group, the sensed results, and the time control signal to generate the signal for controlling the word line control circuit.

* * * * *